United States Patent
Niwa et al.

(10) Patent No.: US 9,281,439 B2
(45) Date of Patent: Mar. 8, 2016

(54) NITRIDE SEMICONDUCTOR ELEMENT AND METHOD FOR PRODUCING SAME

(75) Inventors: Noritaka Niwa, Aichi (JP); Tetsuhiko Inazu, Aichi (JP)

(73) Assignee: Soko Kagaku Co., Ltd., Aichi (JP)

( * ) Notice: Subject to any disclaimer, the term of this patent is extended or adjusted under 35 U.S.C. 154(b) by 0 days.

(21) Appl. No.: 14/344,602

(22) PCT Filed: Sep. 30, 2011

(86) PCT No.: PCT/JP2011/072524
§ 371 (c)(1), (2), (4) Date: Sep. 12, 2014

(87) PCT Pub. No.: WO2013/046419
PCT Pub. Date: Apr. 4, 2013

(65) Prior Publication Data
US 2015/0048304 A1    Feb. 19, 2015

(51) Int. Cl.
| | |
|---|---|
| *H01L 33/40* | (2010.01) |
| *H01L 33/00* | (2010.01) |
| *H01L 33/32* | (2010.01) |
| *H01L 29/45* | (2006.01) |
| *H01L 33/06* | (2010.01) |
| *H01L 33/38* | (2010.01) |

(Continued)

(52) U.S. Cl.
CPC .......... *H01L 33/0095* (2013.01); *H01L 29/452* (2013.01); *H01L 33/06* (2013.01); *H01L 33/32* (2013.01); *H01L 33/387* (2013.01); *H01L 33/40* (2013.01); *H01L 33/405* (2013.01); *H01L 33/62* (2013.01); *H01L 29/2003* (2013.01); *H01L 33/0075* (2013.01); *H01L 33/382* (2013.01); *H01L 2933/0016* (2013.01); *H01L 2933/0066* (2013.01)

(58) Field of Classification Search
CPC .............................. H01L 29/452; H01L 33/40
See application file for complete search history.

(56) References Cited

U.S. PATENT DOCUMENTS 6,130,446 A * 10/2000 Takeuchi et al. ................ 257/99
8,552,455 B2 * 10/2013 Lee ........................ H01L 33/40
257/98

(Continued)

FOREIGN PATENT DOCUMENTS

| JP | 11-8410 A | 1/1999 |
|---|---|---|
| JP | H11307811 A | 11/1999 |

(Continued)

*Primary Examiner* — Mark Prenty
(74) *Attorney, Agent, or Firm* — Haynes Beffel & Wolfeld LLP (57) ABSTRACT

A nitride semiconductor element 1 includes a base structure part 5, and an element structure part 11 formed on the base structure part 5 and having at least an n-type AlGaN based semiconductor layer 6, and p-type AlGaN based semiconductor layers 8, 9, 10, and further includes an n-electrode contact part 13a formed on the n-type AlGaN based semiconductor layer 6, an n-electrode pad part 13b formed on the n-electrode contact part 13a, and a p-electrode 12 formed on the p-type AlGaN based semiconductor layers 8, 9, 10, in which an AlN mole fraction in the n-type AlGaN based semiconductor layer 6 is 20% or more, the n-electrode contact part 13a includes one or more metal layers, and the p-electrode 12 and the n-electrode pad part 13b have a common laminated structure of two or more layers having an Au layer as an uppermost layer, and an Au diffusion preventing layer composed of conductive metal oxide and formed under the uppermost layer to prevent Au diffusion.

13 Claims, 10 Drawing Sheets (51) Int. Cl.
*H01L 33/62* (2010.01)
*H01L 29/20* (2006.01)

(56) References Cited

U.S. PATENT DOCUMENTS

| | | |
|---|---|---|
| 2005/0218414 A1 | 10/2005 | Ueda et al. |
| 2007/0246735 A1 | 10/2007 | Yahata et al. |
| 2009/0305448 A1 | 12/2009 | Shakuda |
| 2012/0168803 A1 | 7/2012 | Lee et al. |

FOREIGN PATENT DOCUMENTS

| | | |
|---|---|---|
| JP | 2004235509 A | 8/2004 |
| JP | 2005340860 A | 12/2005 |
| JP | 2005354040 A | 12/2005 |
| JP | 2006128527 A | 5/2006 |
| JP | 2007115941 A | 5/2007 |
| JP | 2007158262 A | 6/2007 |
| WO | 2006104063 A1 | 10/2006 |
| WO | 2011028076 A2 | 3/2011 |

\* cited by examiner

No Annealing

Fig. 9A Comparison example 1

Fig. 9B Comparison example 2

Fig. 10

NITRIDE SEMICONDUCTOR ELEMENT AND METHOD FOR PRODUCING SAME

CROSS-REFERENCE TO RELATED APPLICATIONS

This application is a National Phase filing under 35 U.S.C. §371 of International Application No. PCT/JP2011/072524 filed on Sep. 30, 2011.

TECHNICAL FIELD

The present invention relates to a nitride semiconductor element and a method for producing the same, particularly relates to a nitride semiconductor element having a light emission center wavelength of about 365 nm or less used in a light emitting diode or a laser diode and a method for producing the same, and more specifically relates to an electrode structure of an n-electrode and a p-electrode used in the element.

BACKGROUND ART

Conventionally, a nitride semiconductor light emitting element such as a light emitting diode (LED) or a semiconductor laser has a light emitting element structure in which a plurality of nitride semiconductor layers are epitaxially grown on a sapphire substrate in many cases. The nitride semiconductor layer is expressed by a general formula: $Al_{1-x-y}Ga_xIn_yN$ ($0 \leq x \leq 1$, $0 \leq y \leq 1$, $0 \leq x+y \leq 1$).

The light emitting element structure is a double heterostructure in which an active layer of the nitride semiconductor layer having a single-quantum-well (SQW) structure or a multi-quantum-well (MQW) structure is sandwiched between an n-type nitride semiconductor layer and a p-type nitride semiconductor layer. In a case where the active layer is an AlGaN based semiconductor layer, its AlN mole fraction (or Al composition ratio) is adjusted so that a bandgap energy can be adjusted to be in a range from a lower limit to an upper limit of bandgap energies of GaN and AlN (about 3.4 eV and about 6.3 eV), and the ultraviolet light emitting element having a light emission wavelength of about 200 nm to about 365 nm can be provided. Specifically, when a forward current flows from the p-type nitride semiconductor layer to the n-type nitride semiconductor layer, light is emitted in the active layer based on the above bandgap energy.

Figure 10:
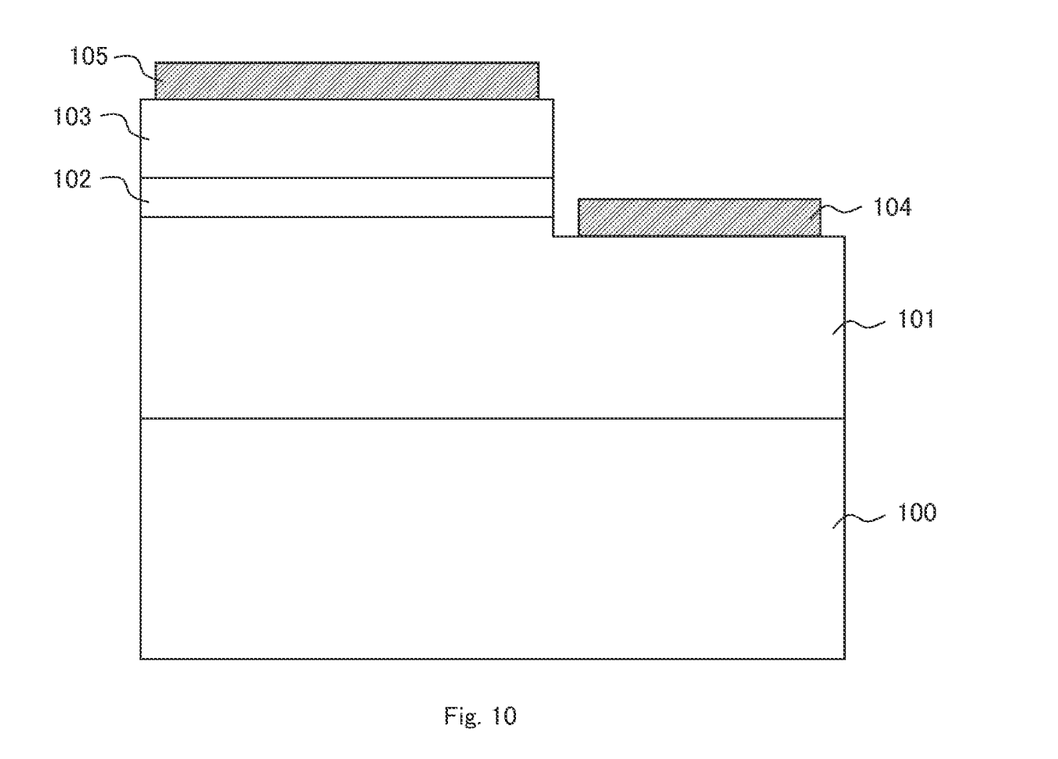
FIG. 10 is a cross-sectional view schematically showing an approximate element structure of a general light emitting diode.

In order to externally supply the forward current, a p-electrode is provided on the p-type nitride semiconductor layer, and an n-electrode is provided on the n-type nitride semiconductor layer. FIG. 10 schematically shows an element structure of a general light emitting diode. The light emitting diode shown in FIG. 10 is configured such that an n-type nitride semiconductor layer 101, an active layer 102, and a p-type nitride semiconductor layer 103 are sequentially deposited on a template 100 formed by depositing a nitride semiconductor layer on a sapphire substrate, the p-type nitride semiconductor layer 103 and the active layer 102 are partially etched away until the n-type nitride semiconductor layer 101 is exposed, the n-electrode 104 is formed on the exposed surface of the n-type nitride semiconductor layer 101, and a p-electrode 105 is formed on a surface of the p-type nitride semiconductor layer 103.

In a case where the active layer is an AlGaN based semiconductor layer, each of the n-type nitride semiconductor layer and the p-type nitride semiconductor layer which sandwich the active layer is an AlGaN based semiconductor layer having an AlN mole fraction higher than that of the active layer. Therefore, in general, each of the n-electrode and the p-electrode is configured to have a laminated structure of two or more layers, in which its lower layer side is provided with a metal layer capable of forming ohmic contact with the n-type AlGaN based semiconductor layer or the p-type AlGaN based semiconductor layer, and its upper layer side is provided with an Au layer so that wire bonding can be performed with an Au wire or the like. As one example, the n-electrode has a four-layer structure of Ti/Al/Ti/Au formed from the lower layer side, and the p-electrode has a two-layer structure of Ni/Au formed from the lower layer side. Here, in a case where light emitted from the active layer is outputted from a rear-face side, when Al is contained in the n-electrode, light reflected from an interface on the rear-face side toward the active layer is reflected again by the n-electrode toward the rear-face side, so that external quantum efficiency of the light emitting element can be improved.

In a normal case, the n-electrode and the p-electrode are each subjected to a heat treatment such as annealing or sintering after deposited and patterned, in order to preferably form the ohmic contact between the metal layer on the lower layer side and the n-type or p-type AlGaN based semiconductor layer. However, due to the heat treatment, the metal layer on the lower layer side is alloyed with Au on the upper layer side, and the alloyed metal other than Au is exposed to a surface of each electrode and deteriorates a surface state, so that the wire bonding cannot be performed in some cases, and the deterioration becomes noticeable especially in a case where a heat treatment temperature is high.

Thus, a countermeasure against the deterioration due to the heat treatment on each electrode surface is conventionally taken such that the Au layer is formed again on each electrode surface by depositing and patterning a bonding layer of Ni and the Au layer. However, this countermeasure has the problem that production cost is increased because the number of the film forming steps is increased. Thus, Patent Document 1 shown below proposes that a barrier metal layer composed of metal having a melting point higher than that of Al is provided on the surface of the Al layer on the lower layer side to isolate the Au layer and the Al layer with the barrier metal layer, to prevent Au on the upper layer side from being alloyed with Al and Ti on the lower layer side.

PRIOR ART DOCUMENT

Patent Document

Patent Document 1: JP 2005-354040 A

DISCLOSURE OF THE INVENTION

Problems to be Solved by the Invention

In a case of an ultraviolet light emitting element having an emission wavelength of 365 nm or less, bandgap energy of an active layer is equal to and more than bandgap energy of GaN, so that bandgap energy of each of AlGaN based semiconductor layers serving as an n-type nitride semiconductor layer and a p-type nitride semiconductor layer which sandwich the active layer is set to be more than that of the active layer. Therefore, an AlN mole fraction of each of the AlGaN based semiconductor layers serving as the n-type nitride semiconductor layer and the p-type nitride semiconductor layer which sandwich the active layer needs to be roughly 20% or more.

Figure 1:
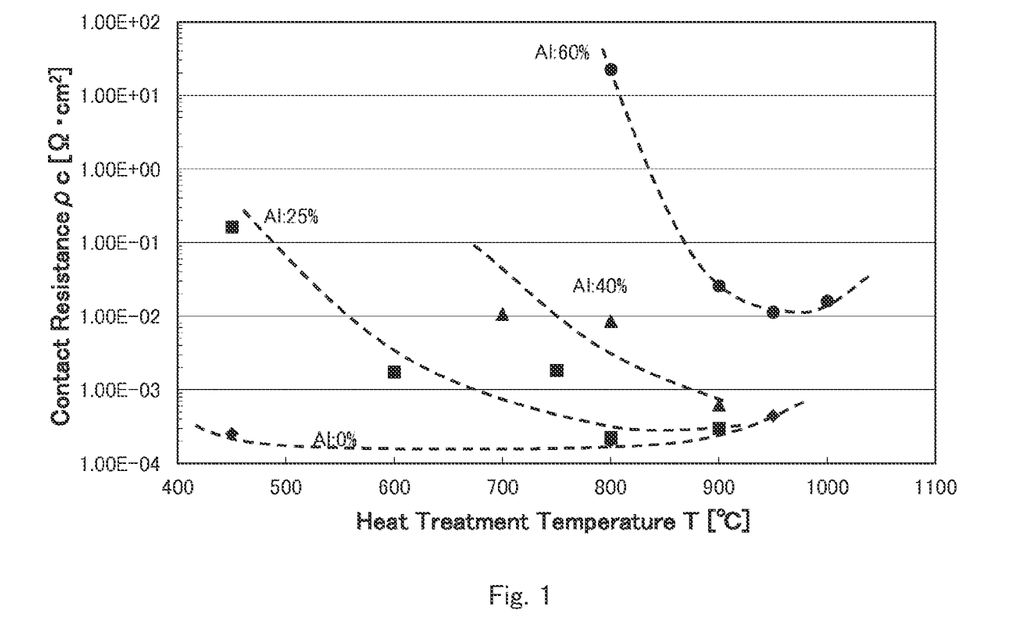
FIG. 1 is a characteristic diagram showing a measured result of a relationship between contact resistance between an n-electrode formed on an n-type AlGaN layer and the n-type AlGaN layer, heat treatment temperature T, and AlN mole fraction of the n-type AlGaN layer.

FIG. 1 shows a result provided by measuring relationships between contact resistance $\rho_c$ (unit: $\Omega$ cm$^2$) between an n-electrode (Ti/Al/Ti/Au: a lowermost layer is Ti, and an uppermost layer is Au) formed on an n-type Al$_x$Ga$_{1-x}$N layer, and the n-type AlGaN layer, and heat treatment temperature T (unit: ° C.) in four cases where AlN mole fractions x of the n-type AlGaN layer are 0%, 25%, 40%, and 60%. Each point shown in FIG. 1 is provided by plotting an average value of the contact resistance of a plurality of samples having the same AlN mole fraction and subjected to the heat treatment at the same temperature, and a curve shown by a broken line shows a trend of a change of each point, for description purposes. In addition, the contact resistance was measured by a well-known transmission line model (TLM) method. The heat treatment temperature was set within a range of 450° C. to 1000° C.

From the measured result in FIG. 1, it is seen that the contact resistance $\rho_c$ is reduced and reaches a lowest value or its vicinity in a certain range of the heat treatment temperature T in each AlN mole fraction x, and the range becomes large and is distributed in a low temperature region as the AlN mole fraction x becomes low, while the range becomes narrow and is moved to a high temperature region as the AlN mole fraction x becomes high. In addition, when the heat treatment temperature T rises beyond the above range, the contact resistance $\rho_c$ is increased, and when the heat treatment temperature T falls below the above range, the contact resistance $\rho_c$ is also increased. In addition, when the heat treatment temperature T falls too low, the ohmic contact is not formed. In addition, although it is not shown in FIG. 1, in a case where the AlN mole fraction x is 0.6 or more, the contact resistance $\rho_c$ largely varies, so that in order to stably obtain the low contact resistance $\rho_c$, the heat treatment needs to be performed at higher temperature in this case.

Therefore, in the case of the ultraviolet light emitting element having the emission wavelength of 365 nm or less, the heat treatment needs to be performed at almost 600° C. or more, to form the n-electrode on the n-type AlGaN layer at low contact resistance. When the emission wavelength becomes short, that is, when the AlN mole fraction x is increased, the heat treatment needs to be performed at even higher temperature.

Figure 2A:
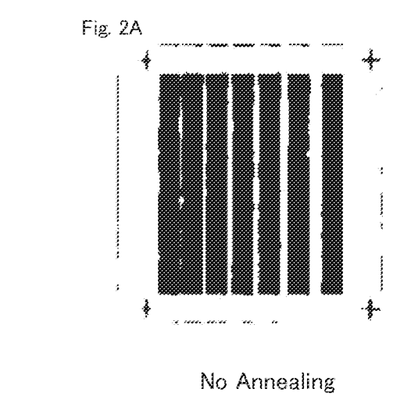
FIGS. 2A to 2H are electrode surface photographs each showing a relationship between a heat treatment temperature and a surface texture of an n-electrode having a four-layer structure of Ti/Al/Ti/Au.
Figure 2B:
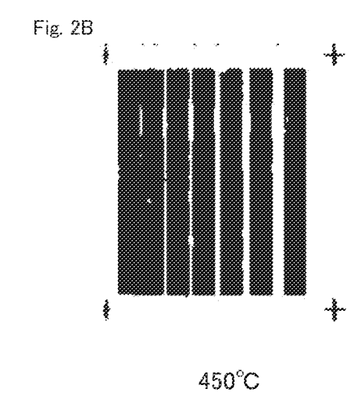
Figure 2C:
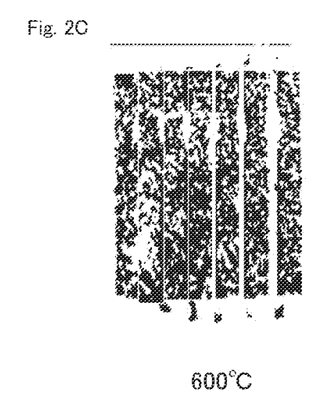
Figure 2D:
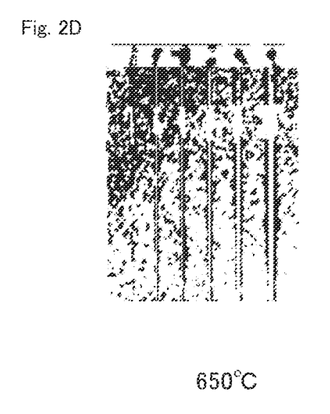
Figure 2E:
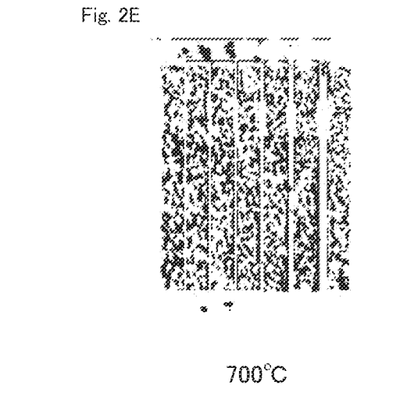
Figure 2F:
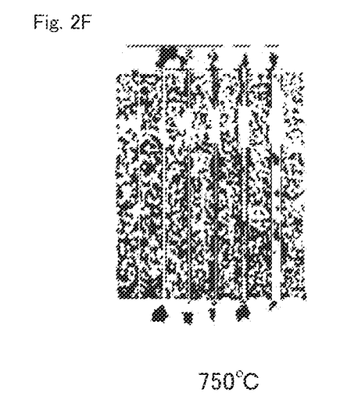
Figure 2G:
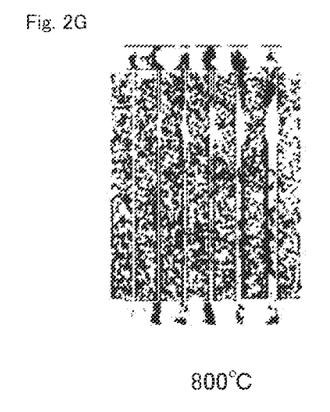
Figure 2H:
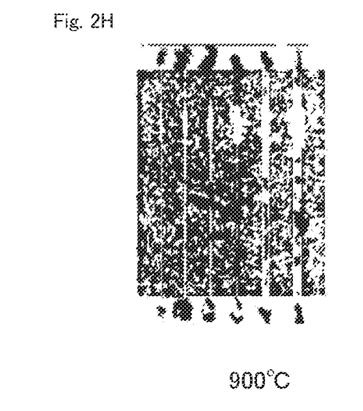

Next, FIGS. 2A to 2H show relationships between alloying between the uppermost Au layer and the metal on the lower layer side in the n-electrode having the four-layer structure of Ti/Al/Ti/Au, and heat treatment temperatures. FIG. 2A is a photograph of an electrode surface of a standard sample on which the heat treatment is not performed, and FIGS. 2B to 2H are photographs of electrode surfaces of heat treated samples whose heat treatment temperatures are 450° C., 600° C., 650° C., 700° C., 750° C., 800° C., and 900° C. In addition, film thicknesses of the layers of the n-electrode are 10 nm/100 nm/50 nm/100 nm from a lower layer side, a heat treatment time is 120 seconds and an atmosphere in a process chamber is a nitrogen atmosphere. Each image shown in FIGS. 2A to 2H is a binary and monochrome image provided from a color photograph, and when the heat treatment temperature is 600° C. or more, the surface is brighter than that of the standard sample, which means Au is alloyed, and Au is not left enough on the electrode surface to perform the bonding. As a result of actually performing the wire bonding for the n-electrode subjected to the heat treatment under the same condition, it is confirmed that the wire bonding cannot be performed.

Figure 3A:
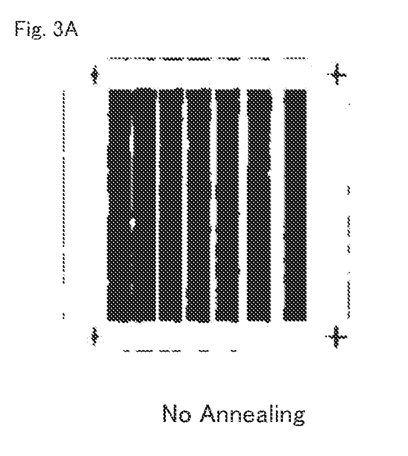
FIGS. 3A and 3B are electrode surface photographs each showing a relationship between a heat treatment temperature and a surface texture of a p-electrode having a two-layer structure of Ni/Au.
Figure 3B:
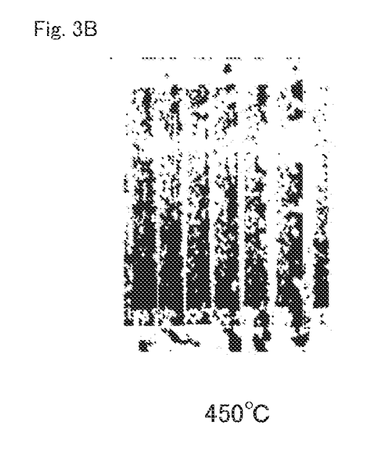

Next, FIGS. 3A and 3B show relationships between alloying between Au of the uppermost layer and Ni on the lower layer side in the p-electrode having the two-layer structure of Ni/Au, and a heat treatment temperature. FIG. 3A is a photograph of an electrode surface of a standard sample on which the heat treatment is not performed, and FIG. 3B is a photograph of an electrode surface of a sample subjected to a heat treatment performed at 450° C. In addition, film thicknesses of the layers of the p-electrode are 60 nm/50 nm from a lower layer side, a heat treatment time is 120 seconds, and an atmosphere in a process chamber is air. Each image shown in FIGS. 3A and 3B is a binary and monochrome image provided from a color photograph, and when the heat treatment temperature is 450° C., the surface is brighter than that of the standard sample, which means Au is alloyed, and Au is not left enough on the electrode surface to perform the bonding. As a result of actually performing the wire bonding for the p-electrode subjected to the heat treatment under the same condition, it is confirmed that the wire bonding cannot be performed.

When the results shown in FIGS. 2 and 3 are compared with the contents disclosed in Patent Document 1, Au is alloyed although each of the n-electrode having the four-layer structure and the p-electrode having the two-layer structure has Ti or Ni having a melting point higher than that of Al, under the Au uppermost layer, so that it is understood that Au is not sufficiently prevented from being alloyed only by providing the barrier metal layer composed of the metal having melting point higher than Al, which is proposed in Patent Document 1.

As described above, in the case of the ultraviolet light emitting element having the emission wavelength of 365 nm or less, the heat treatment at 600° C. or more is needed for the n-electrode. The above method for forming the electrode, in which after the n-electrode and the p-electrode are subjected to the heat treatment, the Au layer is formed again on each electrode and the heat treatment is not performed after that is the most reliable solution, but in this method, the number of steps of forming the electrode is increased, and Au consumption is increased, so that the problem is that the production cost becomes high.

The present invention was made in view of the above problems, and an object of the present invention is to prevent Au from being alloyed on an n-electrode surface and a p-electrode surface, in a nitride semiconductor element.

Means for Solving the Problem

In order to solve the above problem, the present invention provides a nitride semiconductor element including a base structure part, an element structure part having at least an n-type AlGaN based semiconductor layer and a p-type AlGaN based semiconductor layer formed on the base structure part, an n-electrode contact part formed on the n-type AlGaN based semiconductor layer, an n-electrode pad part formed on the n-electrode contact part, and a p-electrode formed on the p-type AlGaN based semiconductor layer, in which an AlN mole fraction of the n-type AlGaN based semiconductor layer is 20% or more, the n-electrode contact part includes one or more metal layers, and the p-electrode and the n-electrode pad part have a common laminated structure of two or more layers having an Au layer as an uppermost layer, and an Au diffusion preventing layer composed of conductive metal oxide and formed under the uppermost layer to prevent Au diffusion.

In addition, according to the present invention, the AlGaN based semiconductor is a group-III nitride semiconductor which is based on a ternary (or binary) compound expressed by a general formula: Al$_x$Ga$_{1-x}$N (x represents an AlN mole fraction, $0 \leq x \leq 1$), and has bandgap energy within a range of bandgap energies of GaN (x=0) and AlN (x=1) (about 3.4 eV and about 6.2 eV) serving as a lower limit and an upper limit.

As long as the condition regarding the above bandgap energy is satisfied, a small amount of In may be contained.

According to the nitride semiconductor element having the above characteristics, the n-electrode includes the n-electrode contact part and the n-electrode pad part, and the p-electrode has the laminated structure common to the n-electrode pad part, so that the n-electrode and p-electrode can be formed such that after the n-electrode contact part is deposited and patterned on the n-type AlGaN based semiconductor layer, and then annealed, the p-electrode and the n-electrode pad part are deposited and patterned on the p-type AlGaN based semiconductor layer and the n-electrode contact part, respectively at the same time, and then annealed. Thus, since this common laminated structure has the Au diffusion preventing layer, Au can be prevented from being alloyed in the heat treatment at the time of forming the p-electrode and the n-electrode pad part. That is, compared with the conventional method in which the p-electrode and the n-electrode are separately deposited and patterned, and then annealed, Au can be prevented from being alloyed without increasing the number of steps. In addition, unlike the barrier metal layer used in Patent Document 1, since the Au diffusion preventing layer is composed of the metal oxide in which metal and oxygen are coupled and a stable state is ensured, the metal in the Au diffusion preventing layer is hardly coupled with Au, and the diffusion of Au can be prevented, so that Au can be prevented from being alloyed with the metal on the lower layer side of the Au diffusion preventing layer.

In addition, it is more preferable that the n-electrode contact part contains Al, in the nitride semiconductor element having the above characteristics. When Al is diffused in the n-type AlGaN based semiconductor layer serving as the base layer by the heat treatment, a preferable ohmic contact can be formed between the n-electrode contact part and the n-type AlGaN based semiconductor layer. In addition, in the case where the nitride semiconductor element is the ultraviolet light emitting element, and also it is the rear-face output type light emitting element using flip-chip bonding, the light reflected by the rear-face toward the inside of the element can be reflected again by the n-electrode toward the rear-face side, so that external quantum efficiency of the light emitting element is improved.

In addition, it is more preferable that the Au diffusion preventing layer is an ITO layer, in the nitride semiconductor element having the above characteristics.

In addition, it is more preferable that the n-electrode contact part does not contain Au, in the nitride semiconductor element having the above characteristics. Thus, Au consumption required for forming the n-electrode can be reduced.

In addition, it is more preferable that a conductive bonding layer is provided between the Au layer as the uppermost layer and the Au diffusion preventing layer in the common laminated structure to bond the Au layer and the Au diffusion preventing layer, and a film thickness of the conductive bonding layer is equal to or less than a half of a film thickness of the Au layer, in the nitride semiconductor element having the above characteristics. Thus, in a case where bonding properties between the Au layer and the Au diffusion preventing layer are not preferable, the Au layer can be prevented from being peeled. In addition, the film thickness of the conductive bonding layer is equal to or less than a half of the film thickness of the Au layer, so that even when the Au layer is alloyed with the conductive bonding layer to some extent, the Au is prevented from being diffused toward the lower layer of the Au diffusion preventing layer. Consequently, Au erosion does not proceed, and the Au layer on the electrode surface can be kept in the bonding-capable state.

The element structure part is a light emitting element structure part including an active layer having an AlGaN based semiconductor layer between the n-type AlGaN based semiconductor layer and the p-type AlGaN based semiconductor layer, in the nitride semiconductor element having the above characteristics.

Furthermore, in order to solve the above problem, the present invention provides a method for producing the nitride semiconductor element having the above characteristics, and the method includes a step of forming the base structure part, a step of forming the light emitting element structure part, a step of forming the n-electrode contact part on the n-type AlGaN based semiconductor layer by depositing and patterning a metal layer of the n-electrode contact part, and then performing a first annealing process, and a step of forming the n-electrode pad part on the n-electrode contact part, and the p-electrode on the p-type AlGaN based semiconductor layer at the same time by depositing and patterning a multilayer film of the common laminated structure, and then performing a second annealing process.

According to the method for producing the above nitride semiconductor element having the above characteristics, the common laminated structure of the p-electrode and the n-electrode pad part has the Au diffusion preventing layer to prevent the Au diffusion, so that Au can be prevented from being diffused and alloyed at the time of the second annealing process performed when the p-electrode and the n-electrode pad part are formed. That is, compared with the conventional method in which the p-electrode and the n-electrode are separately deposited, patterned, and annealed to be formed, the Au can be prevented from being alloyed without increasing the number of the producing steps.

In addition, the p-electrode can be formed at the same time as the n-electrode pad part in the process for forming the n-electrode, so that compared with the conventional case where the p-electrode and the n-electrode are separately formed, Au can be prevented from being alloyed without increasing the number of the producing steps.

In addition, it is more preferable that a process temperature of the second annealing process is lower than a process temperature of the first annealing process, in the method for producing the nitride semiconductor element having the above characteristics. With this configuration, the influence by the second annealing process is prevented, and the first annealing process can be performed at an optimal temperature based on the AlN mole fraction of the n-type AlGaN based semiconductor layer to minimize the contact resistance between the n-electrode contact part and the n-type AlGaN based semiconductor layer.

In addition, it is more preferable that the process temperature of the first annealing process is 700° C. or more and 1000° C. or less, in the method for producing the nitride semiconductor element having the above characteristics.

In addition, it is preferable that the process temperature of the second annealing process is 400° C. or more and 600° C. or less, in the method for producing the nitride semiconductor element having the above characteristics.

BEST MODE FOR CARRYING OUT THE INVENTION

An embodiment of a nitride semiconductor element according to the present invention will be described with reference to the drawings. In addition, in the drawings used in the following description, a substantial part is emphasized to schematically describe the contents of the present invention for ease in understanding the description, so that a dimension ratio of each part is not always the same as a dimension ratio of an actual element. Hereinafter, this embodiment will be described assuming that the nitride semiconductor element according to the present invention is an ultraviolet light emitting element, and furthermore the nitride semiconductor element is a light emitting diode. In the following description, the nitride semiconductor element according to the present invention is simply referred to as "light emitting element".

Figure 4:
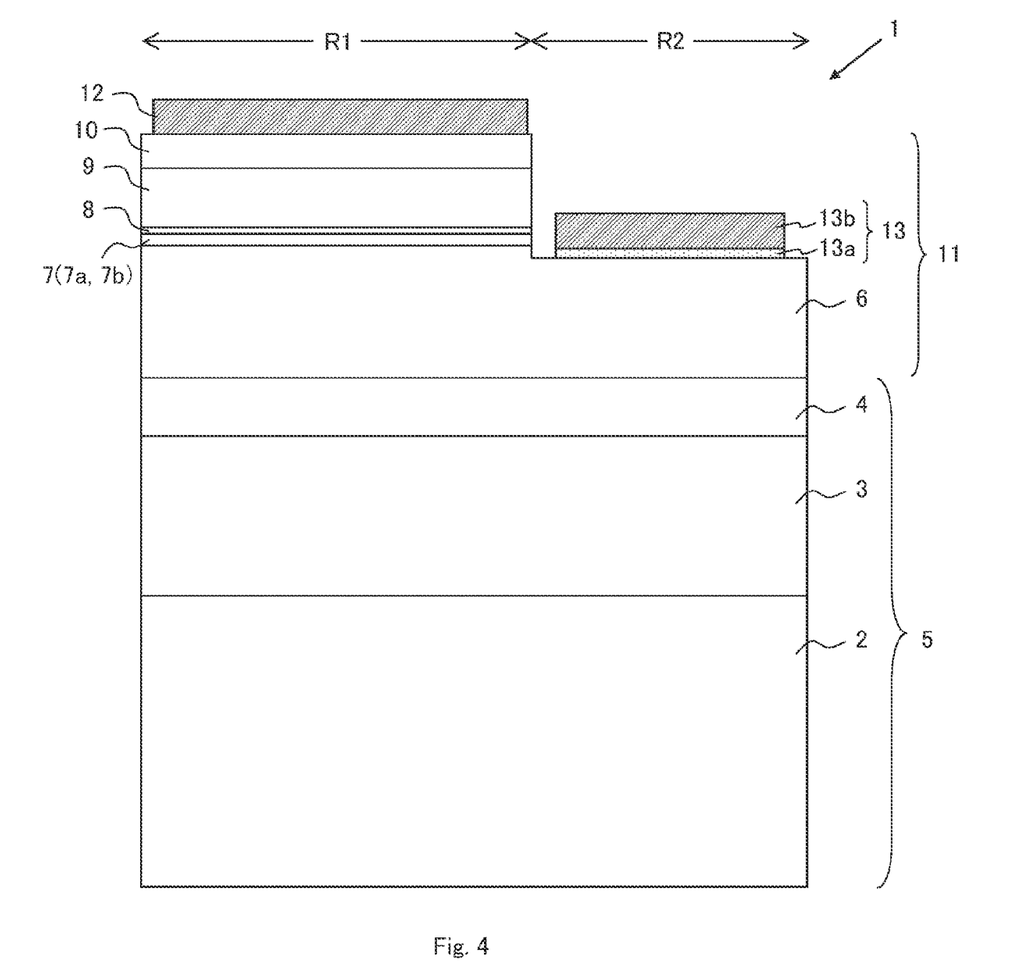
FIG. 4 is a cross-sectional view schematically showing a laminated structure in one embodiment of a nitride semiconductor element according to the present invention.

As shown in FIG. 4, a light emitting element 1 according to this embodiment has a laminated structure in which a substrate is used as a template 5 provided such that an AlN layer 3 and an AlGaN layer 4 are grown on a sapphire substrate 2 (corresponding to a base structure part), and on this template 5, an n-type clad layer 6 composed of n-type AlGaN, an active layer 7, an electron block layer 8 composed of p-type AlGaN having a Al mole fraction higher than the active layer 7, a p-type clad layer 9 composed of p-type AlGaN, and a p-type contact layer 10 composed of p-type GaN are sequentially laminated. The active layer 7, the electron block layer 8, the p-type clad layer 9, and the p-type contact layer 10 provided above the n-type clad layer 6 are partially removed by reactive ion etching until a surface of the n-type clad layer 6 is partially exposed, and a light emitting element structure part 11 including from the n-type clad layer 6 to the p-type contact layer 10 is formed in a first region R1 in the n-type clad layer 6. The active layer 7 has a single-quantum well structure including a barrier layer 7a composed of n-type AlGaN and having a film thickness of 10 nm, and a well layer 7b composed of AlGaN and having a film thickness of 3.5 nm, as one example. The active layer 7 may have a double heterojunction structure in which the active layer is sandwiched between n-type and p-type AlGaN layers each having a high Al mole fraction provided as a lower layer and an upper layer, and may have a multi-quantum well structure in which the above single-layer quantum well structures are stratified. In addition, a p-electrode 12 is formed on a surface of the p-type contact layer 10, and an n-electrode 13 is formed on a part of a surface of a second region R2 other than the first region R1 in the n-type clad layer 6.

Each AlGaN layer is formed by a well-known epitaxial growth method such as a metal organic vapor phase epitaxy (MOVPE) or molecular beam epitaxy (MBE), and Si is used as a donar impurity of the n-type layer, and Mg is used as an acceptor impurity of the p-type layer, for example. In addition, the AlN layer and the AlGaN layer not provided with the conductivity type are undoped layers to which the impurity is not doped. In addition, AlN mole fractions of the n-type AlGaN layer and the active layer, that is, those of the AlGaN layer 4, the n-type clad layer 6, and the electron block layer 8 are 20% or more and 100% or less, and the AlN mole fraction of the active layer 7 is 0% or more and 80% or less. According to this embodiment, it is assumed that a peak emission wavelength of the light emitting element 1 is 223 nm or more and 365 nm or less. According to this embodiment, it is assumed that the light emitting element is a rear-face output type light emitting element in which light emitted from the well layer 7b is outputted from the sapphire substrate 2, so that the AlN mole fraction of the AlGaN layer 4 needs to be set higher than that of the well layer 7b, and the AlN mole fraction of the AlGaN layer 4 is set to be equal to that of the n-type clad layer 6, as one example. In addition, the AlN mole fraction of the AlGaN layer 4 may be higher than that of the n-type clad layer 6.

As for a film thickness of each AlGaN layer in the light emitting element structure part other than the active layer 7, the n-type clad layer 6 is 2000 nm, the electron block layer 8 is 2 nm, the p-type clad layer 9 is 540 nm, and the p-type contact layer 10 is 200 nm in thickness, for example. In addition, regarding the template 5, a film thickness of the AlN layer 3 is set to 2200 nm or more and 6600 nm or less, and more preferably 3000 nm or more and 6000 nm or less, and a film thickness of the AlGaN layer 4 is set to 200 nm or more and 300 nm or less. In addition, according to this embodiment, since the n-type clad layer 6 is formed on the AlGaN layer 4 as the same AlGaN layer, the conductivity type of the AlGaN layer 4 may be an n-type layer instead of the undoped layer, so that the AlGaN layer 4 may be integrated with the n-type clad layer 6, and the template 5 may only include the AlN layer 3.

Figure 5:
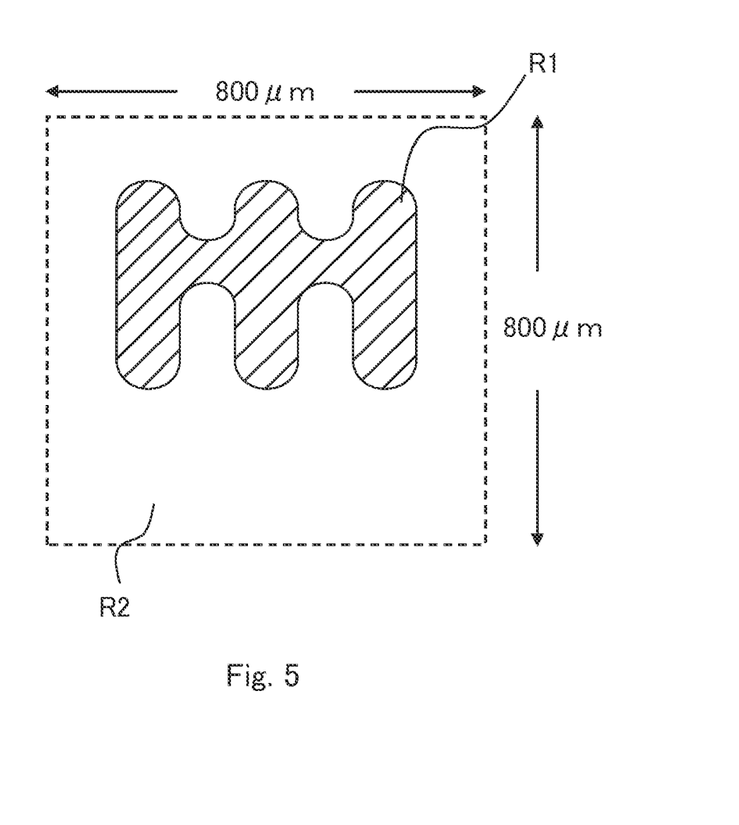
FIG. 5 is a plan view schematically showing a planar-view pattern in the one embodiment of the nitride semiconductor element according to the present invention.

FIG. 5 shows one example of a pattern of the light emitting element 1 in planar view. FIG. 5 shows the first region R1 and the second region R2 before the p-electrode 12 and the n-electrode 13 are formed. As one example, the p-electrode 12 is formed on almost a whole surface of the first region R1, and the n-electrode 13 is formed almost a whole surface of the second region R2. In addition, a chip size of the light emitting element 1 used in a working example which will be described below is 800 μm×800 μm, and an area of the first region R1 is about 168000 μm². In addition, the first region R1 shown in FIG. 4 is a part of the first region R1 shown in FIG. 5.

According to this embodiment, as will be described below, laminated structures of the p-electrode 12 and the n-electrode 13 are characteristic, and as long as the p-electrode 12 is formed on the p-type AlGaN layer, the n-electrode 13 is formed on the n-type AlGaN layer, and the element structure functioning as the ultraviolet light emitting element is provided, the structures of the template 5 and the light emitting element structure part 11, and the film thickness and composition of each layer may be appropriately changed.

Figure 6A:
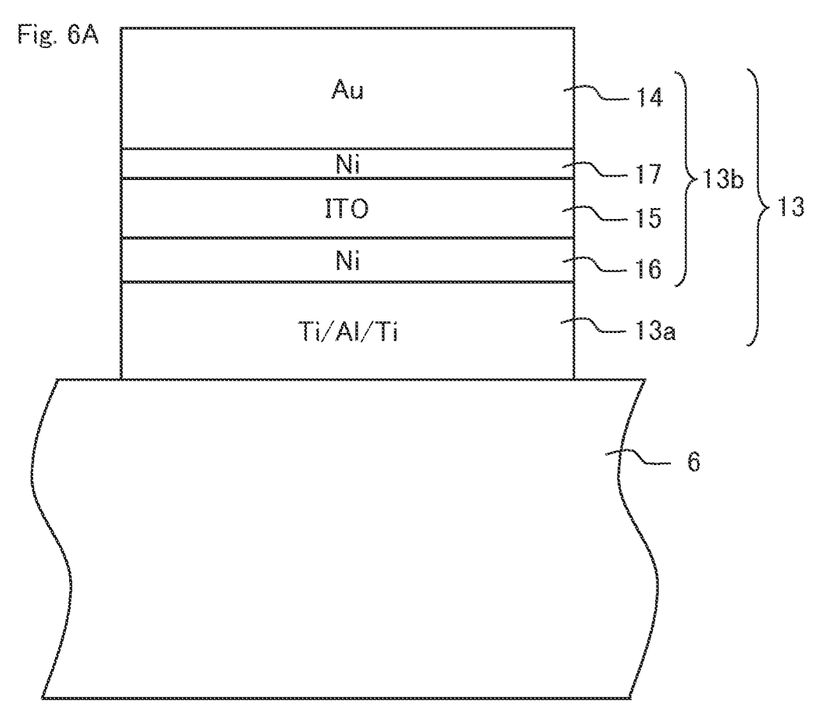
FIGS. 6A and 6B are cross-sectional views schematically showing electrode structures of a p-electrode and an n-electrode in the one embodiment of the nitride semiconductor element according to the present invention.
Figure 6B:
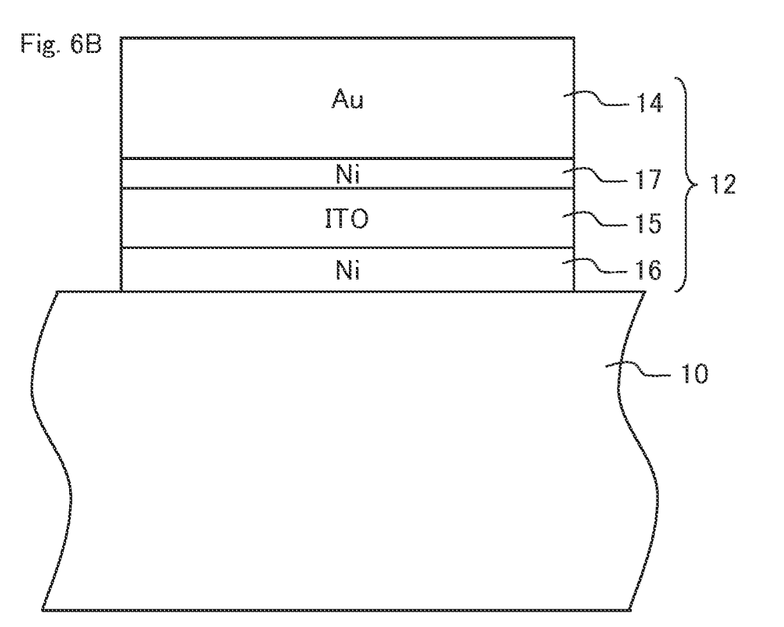

Next, the laminated structures of the p-electrode 12 and the n-electrode 13 will be described with reference to FIGS. 6A and 6B. FIG. 6A shows the laminated structure of the n-electrode 13, and FIG. 6B shows the laminated structure of the p-electrode 12. According to this embodiment, the n-electrode 13 has a two-stage structure having an n-electrode contact part 13a and an n-electrode pad part 13b, and the n-electrode pad part 13b and the p-electrode 12 have exactly the same laminated structure (common laminated structure), which is a first characteristic. In addition, the n-electrode contact part 13a includes one or more metal layers, and each of the n-electrode pad part 13b and the p-electrode 12 has a bonding Au layer 14 as an uppermost layer, and an Au diffusion preventing layer 15 composed of conductive metal oxide to prevent diffusing of Au, on a lower layer side of the Au layer 14, which is a second characteristic.

In addition, according to this embodiment, one preferable example of the n-electrode contact part 13a has a three-layer structure in which Ti/Al/Ti having film thicknesses of 10 nm/100 nm/50 nm, respectively are laminated from a lower layer side. In addition, one preferable example of the n-electrode pad part 13b and the p-electrode 12 has a four-layer structure (common laminated structure) in which Ni/ITO/Ni/Au having film thicknesses of 60 nm/100 nm/10 nm/200 nm, respectively are laminated from a lower layer side. Here, ITO (indium tin oxide) corresponds to the Au diffusion preventing layer 15. The Au diffusion preventing layer 15 may be composed of another conductive metal oxide such as ZnO or NiO instead of ITO.

As for the common laminated structure of 12 and 13b in the preferable one example, regarding the p-electrode 12, a Ni layer 16 as a lowermost layer is used as a metal layer which can preferably form the ohmic contact with the p-type contact layer 10. In a case where the Au diffusion preventing layer 15 can preferably form the ohmic contact with the p-type contact layer 10, the Ni layer 16 as the lowermost layer may be omitted. In the case where the Au diffusion preventing layer 15 is the ITO layer, the Ni layer 16 as the lowermost layer can be omitted.

In addition, a Ni layer 17 formed on the ITO layer 15 functions as a bonding layer to ensure bonding properties between the Au layer 14 and the ITO layer 15, so that several nm is enough for its film thickness, and 10 nm is set in this embodiment. When the film thickness of the Ni layer 17 as the bonding layer is increased, the Ni layer 17 is alloyed with the Au layer 14, so that the thickness is preferably to be equal to or less than half of a film thickness of the Au layer 14 at most. In addition, in a case where adhesion properties between the Au diffusion preventing layer 15 and the Au layer 14 are preferably provided, the Ni layer 17 as the bonding layer may be omitted.

The n-electrode contact part 13a may have a two-layer structure of Ti/Al or a single-layer structure of Al other than the above three-layer structure. More specifically, the n-electrode contact part 13a preferably has a structure in which Al is contained, but Au is not contained.

Next, a description will be given of a result of an experiment to prove that the ITO layer 15 functions as the Au diffusion preventing layer. The proving experiment was performed such that three metal multilayer film samples (samples #1 to #3) were prepared, and subjected to an annealing process by rapid thermal annealing (RTA) at 450° C. for 120 seconds in an air atmosphere, and then a reflection rate of the metal multilayer film surface was measured. The sample #1 was made such that a two-layer film of Au/Ni (having film thicknesses of 50 nm/60 nm, respectively) was provided on a sapphire substrate from a lower layer side by vapor deposition. The sample #2 was made such that a two-layer film of ITO/Ni (having film thicknesses of 100 nm/60 nm, respectively) was provided on a sapphire substrate from a lower layer side by vapor deposition. The sample #3 was made such that a three-layer film of Au/ITO/Ni (having film thicknesses of 50 nm/100 nm/60 nm, respectively) was provided on a sapphire substrate from a lower layer side by vapor deposition. The reflection rate was measured such that each sample surface was irradiated with the ultraviolet light having a wavelength of 250 nm to 400 nm from an ultraviolet light source, and intensity of its reflected light was measured with an integrating sphere.

Figure 7:
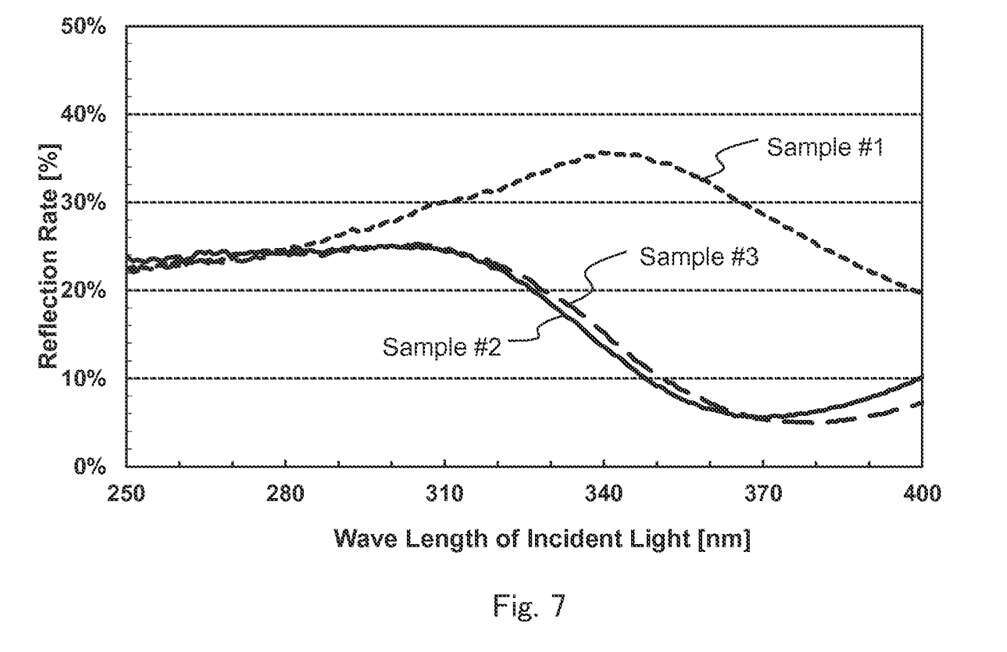
FIG. 7 is a view showing a result of an experiment to prove that an ITO layer functions as an Au diffusion preventing layer.

FIG. 7 shows the measured result of the reflection rates. As shown in FIG. 7, while there is almost no difference in reflection rate between the sample #2 and the sample #3, there is a difference in reflection rate between the sample #1 and the sample #2 and between the sample #1 and the sample #3. This means that there is no difference in surface texture of the multilayer film between the sample #2 and the sample #3, and there is a difference in surface texture of the multilayer film between the sample #1 and the sample #2 and between the sample #1 the sample #3. Thus, it is understood that Au is alloyed with Ni in the sample #1, while Au is prevented from being alloyed with Ni by the ITO layer, in the sample #3.

Next, a method for forming each of the P-electrode 12 and the n-electrode 13 will be described with reference to process chart in FIG. 8.

First, the layers in the template 5 and the light emitting element structure part 11 in the light emitting element 1 are formed by the well-known growing method as described above (steps #1 and #2). After the template 5 and the light emitting element structure part 11 are formed, a first photoresist serving as a reverse pattern of the n-electrode 13 is formed (step #3A), and a Ti/Al/Ti multilayer film serving as the n-electrode contact part 13a is deposited on a whole surface by electron beam evaporation method or the like (step #3B). Then, the first photoresist is removed by a liftoff process, the multilayer film of Ti/Al/Ti on the first photoresist is removed so that patterning is performed (step #3C), and a first annealing process is performed by rapid thermal annealing (RTA) or the like (step #3D), whereby the n-electrode contact part 13a is formed on the surface of the n-type clad layer 6 which is exposed in the second region R2 (step #3). A process temperature of the first annealing process is set to be an optimal process temperature so that contact resistance with the n-type clad layer 6 can be reduced, based on the AlN mole fraction of the n-type clad layer 6 serving as the base, and the process temperature is set within a range of 600° C. to 1000° C., preferably 700° C. to 1000° C., for example. In addition, according to this embodiment, the first annealing process is performed for 120 seconds in a nitrogen atmosphere, for example. Note that the condition of the first annealing process is not limited to the condition illustrated in this embodiment.

After the n-electrode contact part 13a is formed, a second photoresist serving as a reverse pattern of the p-electrode 12 and the n-electrode 13 is formed (step #4A), and a Ni/ITO/Ni/Au multilayer film serving as the p-electrode 12 and the n-electrode pad part 13b is deposited on the whole surface by electron beam evaporation or the like (step #4B). Then, the second photoresist is removed by a liftoff process, the Ni/ITO/Ni/Au multilayer film on the second photoresist is removed so that patterning is performed (step #4C), and a second annealing process is performed by the rapid thermal annealing (RTA) or the like (step #4D), whereby the p-electrode 12 is formed on the surface of the p-type contact layer 10, and the n-electrode pad part 13b is formed on the n-electrode contact part 13a (step #4). A process temperature of the second annealing process is set to be an optimal process temperature so that contact resistance with the p-type contact layer 10 can be reduced, and the process temperature is set within a range of 400° C. to 600° C., for example. In addition, according to this embodiment, the second annealing process is performed for 120 seconds in an air atmosphere, for example. Note that the condition of the second annealing process is not limited to the condition illustrated in this embodiment.

Then, the electrode surface is subjected to dry cleaning by an ashing process (step #5), and a mounting process such as bonding is performed (step #6).

Next, a description will be given of a result of an experiment performed such that bonding is actually performed with Au wires for the p-electrodes and the n-electrodes of the light emitting element 1 in this embodiment (working example 1), and light emitting elements having conventional electrode structures (comparison examples 1 and 2), to find whether or not the bonding can be physically performed.

Figure 8:
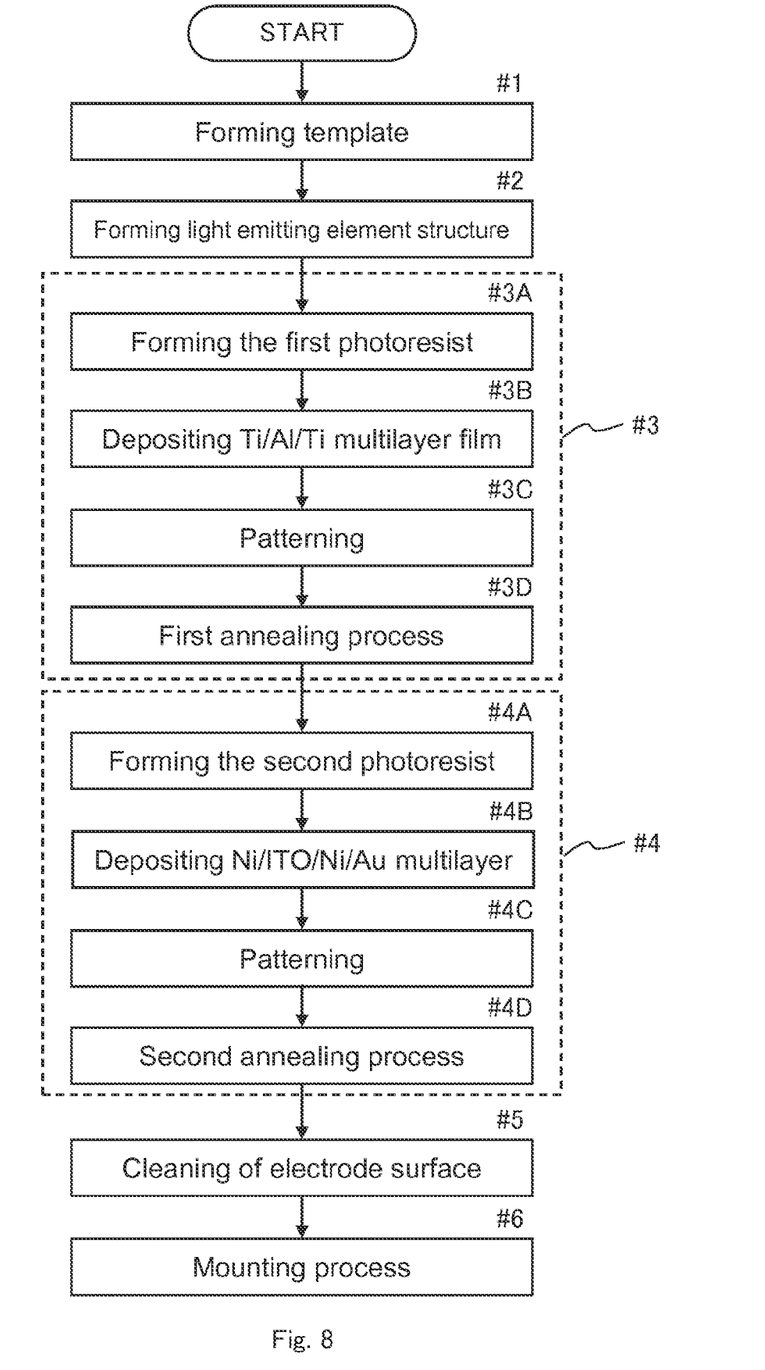
FIG. 8 is a process chart roughly showing a method for forming the p-electrode and the n-electrode in the one embodiment of the nitride semiconductor element according to the present invention.

The electrode structures of the n-electrode and the p-electrode of the working example 1 used in this experiment is the same as the structures shown in FIGS. 6A and 6B, and is formed through the processes shown in FIG. 8. In the first annealing process, processing temperature is 950° C., a processing time is 60 seconds, and an atmospheric gas is nitrogen. In the second annealing process, a processing temperature is 450° C., a processing time is 120 seconds, and an atmospheric gas is air.

Figure 9A:
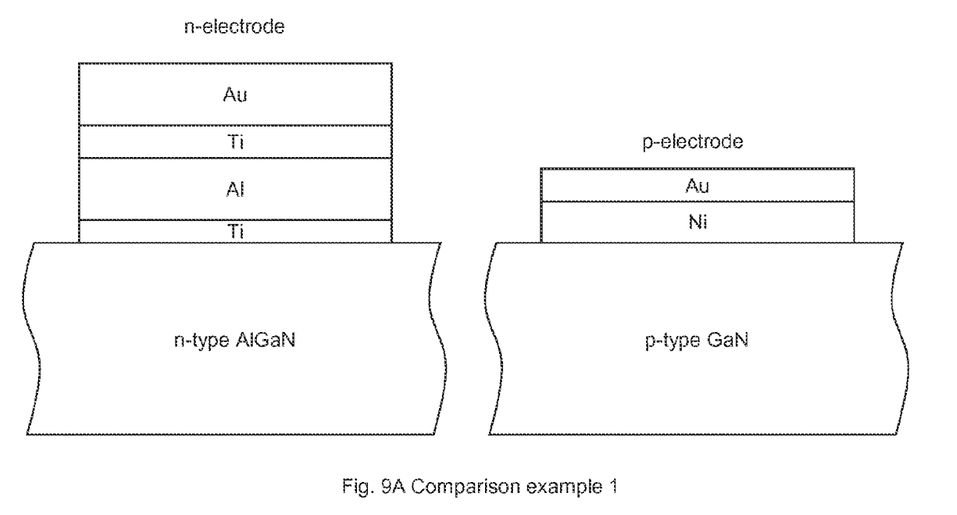
FIGS. 9A and 9B are cross-sectional views schematically showing electrode structures of p-electrodes and n-electrodes in two comparison examples used in a bonding proving experiment.
Figure 9B:
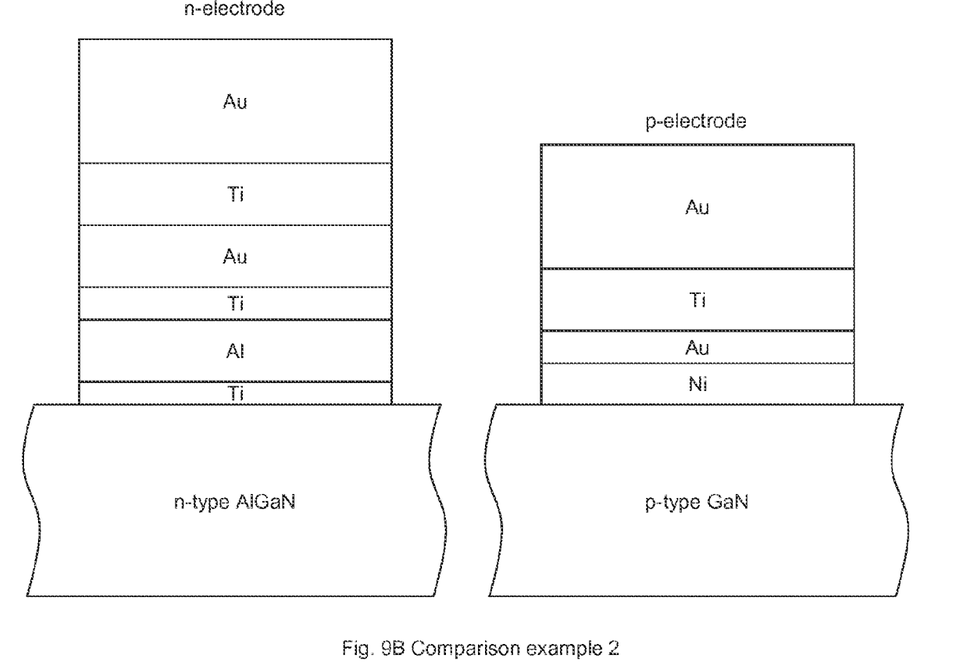

FIG. 9A shows electrode structures of an n-electrode and a p-electrode in the comparison example 1 used in this experiment, and FIG. 9B shows electrode structures of an n-electrode and a p-electrode in the comparison example 2 used in this experiment. In the comparison example 1, the electrode structures are provided such that the n-electrode having a four-layer structure of Ti/Al/Ti/Au and the p-electrode having a two-layer structure of Ni/Au are formed and subjected to the annealing process separately. Film thicknesses of the layers of the n-electrode in the comparison example 1 are 10 nm/100 nm/50 nm/100 nm from a lower layer side, and a processing temperature, a processing time, and an atmospheric gas in the annealing process of the n-electrode are the same as those of the first annealing process in the working example 1. Film thicknesses of the layers of the p-electrode in the comparison example 1 are 60 nm/50 nm from a lower surface side, and a processing temperature, a processing time, and an atmospheric gas in an annealing process of the p-electrode are the same as those of the second annealing process in the working example 1. The comparison example 2 has the electrode structure in which the Ti/Au layer is formed again without performing the annealing process, on each surface of the p-electrode and the n-electrode in the comparison example 1. Film thicknesses of the Ti/Au layer formed again are 100 nm/200 nm from a lower layer side. In addition, an AlN mole fraction of the n-type AlGaN serving as the base layer of each of the n-electrodes in the working example 1 and the comparison examples 1 and 2 is 60%, and a base layer of each of the p-electrodes in the working example 1 and the comparison examples 1 and 2 is the p-type GaN.

According to the result of the proving experiment, in the comparison example 1, since Au in the uppermost layer was alloyed, a sufficient amount of Au was not left on each electrode surface, so that the bonding could not be physically performed, while in the working example 1 (light emitting element 1) and the comparison example 2, the bonding could be preferably performed. According to this result, it is understood that as for the light emitting element 1, since the ITO layer 15 is provided for each of the n-electrode pad part 13b and the p-electrode 12, Au in the uppermost layer can be prevented from diffusing, and each electrode surface can be prevented from deteriorating.

The embodiment of the light emitting element 1 has been described in detail in the above. According to the above embodiment, as the base structure part and the light emitting element structure part constituting the light emitting element 1, the template 5 and the light emitting element structure part 11 shown in FIG. 4 have been described as one example, but the laminated structure, the film thickness, and the AlN mole fraction of the AlGaN layer illustrated in the above description are just one example, and the template 5 and the light emitting element structure part 11 are not limited to the above specific example. In addition, the planar shape of the light emitting element 1 is not limited to the shape shown in FIG. 5.

Furthermore, the method for forming each of the p-electrode 12 and the n-electrode 13 is not limited to the specific example of the above embodiment, so that the patterning for each of the n-electrode contact part 13a, the p-electrode 12, and the n-electrode pad part 13b is not limited to the liftoff method, and an etching method may be used. In the case where the etching method is used, the deposition of each multilayer film, the formation of the photoresist, and the etching order are to be conformed to the well-known etching method, and the pattern of the n-electrode contact part 13a may be formed to be larger than the n-electrode 13.

In addition, according to the above embodiment, it has been assumed that the nitride semiconductor element according to the present invention is the ultraviolet light emitting element, and furthermore the light emitting diode, but the electrode structure and the method for producing the same described in the above embodiment can be applied to a laser diode, and furthermore can be applied to an ultraviolet light receiving element.

INDUSTRIAL APPLICABILITY

The nitride semiconductor element according to the present invention can be applied to a light emitting diode or the like in which an AlN mole fraction of an n-type clad layer is 20% or more, and is useful in improving surface texture of each of a p-electrode and an n-electrode.

EXPLANATION OF REFERENCES

1 Nitride semiconductor element (light emitting diode)
2 Sapphire substrate
3 AlN layer
4 AlGaN layer
5 Template (base structure part)
6 n-type clad layer (n-type AlGaN)
7 Active layer
7a Barrier layer
7b Well layer
8 Electron block layer (p-type AlGaN)
9 p-type clad layer (p-type AlGaN)
10 p-contact layer (p-type GaN)
11 Light emitting element structure part (element structure part)

12 p-electrode
13 n-electrode
13a n-electrode contact part
13b n-electrode pad part
14 Au layer
15 Au diffusion preventing layer (ITO layer)
16 Ni layer
17 Ni layer (bonding layer)
R1 First region
R2 Second region

The invention claimed is:

1. A nitride semiconductor element comprising:
a base structure part;
an element structure part having at least an n-type AlGaN based semiconductor layer and a p-type AlGaN based semiconductor layer formed on the base structure part;
an n-electrode contact part formed on the n-type AlGaN based semiconductor layer;
an n-electrode pad part formed on the n-electrode contact part; and
a p-electrode formed directly on the p-type AlGaN based semiconductor layer, wherein an AlN mole fraction of the n-type AlGaN based semiconductor layer is 20% or more,
the n-electrode contact part comprises one or more metal layers, and
a laminated structure of the p-electrode and a laminated structure of the n-electrode pad part are totally the same laminated structure, and the laminated structure is a common laminated structure of two or more layers having an Au layer as an uppermost layer, and an Au diffusion preventing layer made of conductive metal oxide and formed under the uppermost layer to prevent Au diffusion.

2. The nitride semiconductor element according to claim 1, wherein the n-electrode contact part contains Al.

3. The nitride semiconductor element according to claim 1, wherein the Au diffusion preventing layer is an ITO layer.

4. The nitride semiconductor element according to claim 1, wherein the n-electrode contact part does not contain Au.

5. The nitride semiconductor element according to claim 1, wherein
a conductive bonding layer is provided between the Au layer as the uppermost layer and the Au diffusion preventing layer in the common laminated structure, to bond the Au layer and the Au diffusion preventing layer, and
a film thickness of the conductive bonding layer is equal to or less than a half of a film thickness of the Au layer.

6. The nitride semiconductor element according to claim 1, wherein the element structure part is a light emitting element structure part including an active layer between the n-type AlGaN based semiconductor layer and the p-type AlGaN based semiconductor layer, the active layer having an AlGaN based semiconductor layer.

7. A method for producing a nitride semiconductor element, comprising:

a step of forming a base structure part;
a step of forming an element structure part, the element structure part having at least an n-type AlGaN based semiconductor layer and a p-type AlGaN based semiconductor layer formed on the base structure part;
a step of forming an n-electrode contact part having one or more metal layers on the n-type AlGaN based semiconductor layer by depositing and patterning a metal layer of the n-electrode contact part, and then performing a first annealing process; and
a step of forming an n-electrode pad part on the n-electrode contact part, and the p-electrode formed directly on the p-type AlGaN based semiconductor layer at the same time by depositing and patterning a multilayer film of the common laminated structure, and then performing a second annealing process, wherein:
an AlN mole fraction of the n-type AlGaN based semiconductor layer is 20% or more; and
a laminated structure of the p-electrode and a laminated structure of the n-electrode pad part are totally the same laminated structure, and the laminated structure is a common laminated structure of two or more layers having an Au layer as an uppermost layer, and an Au diffusion preventing layer made of conductive metal oxide and formed under the uppermost layer to prevent Au diffusion.

8. The method for producing the nitride semiconductor element according to claim 7, wherein
a process temperature of the second annealing process is lower than a process temperature of the first annealing process.

9. The method for producing the nitride semiconductor element according to claim 7, wherein the process temperature of the first annealing process is 700° C. or more and 1000° C. or less.

10. The method for producing the nitride semiconductor element according to claim 8, wherein the process temperature of the first annealing process is 700° C. or more and 1000° C. or less.

11. The method for producing the nitride semiconductor element according to claim 7, wherein the process temperature of the second annealing process is 400° C. or more and 600° C. or less.

12. The method for producing the nitride semiconductor element according to claim 8, wherein the process temperature of the second annealing process is 400° C. or more and 600° C. or less.

13. The method for producing the nitride semiconductor element according to claim 9, wherein the process temperature of the second annealing process is 400° C. or more and 600° C. or less.

* * * * *